(12) United States Patent
Nüllen et al.

(10) Patent No.: US 11,239,431 B2
(45) Date of Patent: Feb. 1, 2022

(54) ORGANIC ELECTRONIC DEVICE, ORGANIC SEMICONDUCTING MATERIAL AND A BORANE COMPOUND

(71) Applicant: Novaled GmbH, Dresden (DE)

(72) Inventors: Max Peter Nüllen, Dresden (DE); Markus Hummert, Dresden (DE); Horst Hartman, Dresden (DE); Dieter Kaufmann, Clausthal-Zellerfeld (DE); Iryna Savych, Clausthal-Zellerfeld (DE)

( * ) Notice: Subject to any disclaimer, the term of this patent is extended or adjusted under 35 U.S.C. 154(b) by 322 days.

(21) Appl. No.: 16/568,635

(22) Filed: Sep. 12, 2019

(65) Prior Publication Data

US 2020/0091430 A1    Mar. 19, 2020

(30) Foreign Application Priority Data

Sep. 17, 2018  (DE) .......................... 102018122708.6

(51) Int. Cl.
*H01L 51/50* (2006.01)
*H01L 51/00* (2006.01)

(52) U.S. Cl.
CPC ........ *H01L 51/008* (2013.01); *H01L 51/5056* (2013.01); *H01L 51/5092* (2013.01)

(58) Field of Classification Search
None
See application file for complete search history.

(56) References Cited

U.S. PATENT DOCUMENTS

| 8,674,141 | B2 | 3/2014 | Stoessel et al. | |
|---|---|---|---|---|
| 2009/0134384 | A1* | 5/2009 | Stoessel | C09B 57/00 257/40 |

FOREIGN PATENT DOCUMENTS

WO   2017/029370 A1   2/2017

OTHER PUBLICATIONS

German Office Action for German Application No. 102018122708.6 dated Jun. 19, 2019 (5 pages).

* cited by examiner

*Primary Examiner* — Gregory D Clark
(74) *Attorney, Agent, or Firm* — Eversheds-Sutherland (US) LLP

(57) ABSTRACT

The present invention relates to an organic electronic device or an organic semiconducting material comprising a borane compound, the borane compound comprising at least one boron atom in the oxidation state (III) and at least one anionic ligand, the anionic ligand having the formula (Ia) or (Ib)

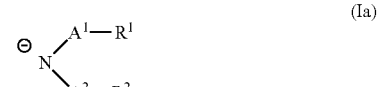

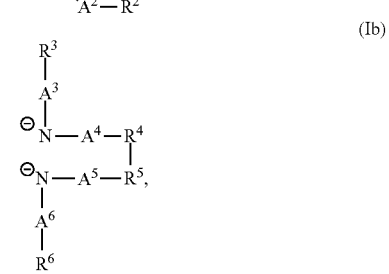

wherein in the formulas (Ia) and (Ib)
$A^1$ to $A^6$ are independently selected from the group consisting of $CO$, $SO_2$ or $PDX^1$;
$X^1$ is independently selected from the group consisting of halide, nitrile, halogenated or perhalogenated $C_1$ to $C_{20}$ (Continued)

alkyl, halogenated or perhalogenated $C_6$ to $C_{20}$ aryl, and halogenated or perhalogenated heteroaryl having 5 to 20 ring-forming atoms; and $R^1$ to $R^6$ are independently selected from the group consisting of substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, and substituted or unsubstituted $C_5$ to $C_{20}$ heteroaryl, wherein it may be provided that $R^1$ and $R^2$ are linked to each other to form a ring;

as well as to a respective borane compound.

10 Claims, 2 Drawing Sheets

ORGANIC ELECTRONIC DEVICE, ORGANIC SEMICONDUCTING MATERIAL AND A BORANE COMPOUND

CROSS REFERENCE TO RELATED APPLICATIONS

This application claims priority to German Patent Application No. 10 2018 122708.6, filed Sep. 17, 2018. The content of this application is incorporated herein by reference.

TECHNICAL FIELD

The present invention relates to an organic electronic device, an organic semiconducting material and a borane compound.

BACKGROUND ART

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic and/or organometallic compounds.

When a voltage is applied to the anode and the cathode, holes injected from the anode electrode move to the EML, via the HTL, and electrons injected from the cathode electrode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency.

WO 2017/029370 A1 discloses metal amides and the use thereof as hole injection layer for organic light-emitting diodes.

Angewandte Chemie, International Edition 2011, 50, 2098-2101, discloses as an air-sensitive, vacuum distillable dense liquid, a compound to which a composition $C_{10} H_{14} B F_6 N O_4 S_2$, structure

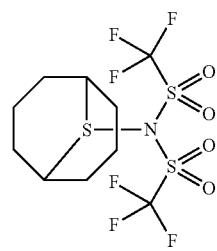

and Chemical Abstract Service number 1283232-76-7 were assigned.

WO 2017/029366 A1 discloses a hole injection layer for an organic light-emitting diode comprising a triaryl amine compound doped with a charge neutral metal amide compound, the hole injection layer having a thickness of 20 to 1,000 nm.

However, there is still a need to improve the performance of organic electronic devices and/or organic semiconducting materials, in particular of optoelectronic devices comprising an organic charge transport material, such as organic light emitting diodes (OLEDs) or organic photovoltaic (OPV) devices and of complex devices comprising the said optoelectronic devices, such as OLED displays.

It is, therefore, the object of the present invention to provide an organic electronic device and/or an organic semiconducting material overcoming drawbacks of the prior art, in particular to provide organic electronic devices/organic semiconducting materials comprising hole transport materials, hole injection materials, hole generation materials or two or more thereof for improving the performance of a respective device, in particular for improving initial voltage, efficiency or voltage stability thereof.

SUMMARY OF THE INVENTION

The above object is achieved by an organic electronic device comprising a borane compound, the borane compound comprising at least one boron atom in the oxidation state (III) and at least one anionic ligand, the anionic ligand having the formula (Ia) or (Ib)

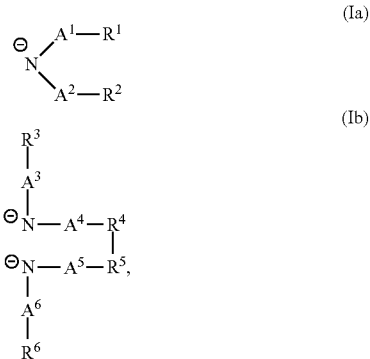

wherein in the formulas (Ia) and (Ib)
$A^1$ to $A^6$ are independently selected from the group consisting of CO, $SO_2$ or $PDX^1$;
$X^1$ is independently selected from the group consisting of halide, nitrile, halogenated or perhalogenated $C_1$ to $C_{20}$ alkyl, halogenated or perhalogenated $C_6$ to $C_{20}$ aryl, and halogenated or perhalogenated heteroaryl having 5 to 20 ring-forming atoms; and
$R^1$ to $R^6$ are independently selected from the group consisting of substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, and substituted or unsubstituted $C_5$ to $C_{20}$ heteroaryl, wherein it may be provided that $R^1$ and $R^2$ are linked to each other to form a ring.

The groups $A^1$ to $A^6$ comprised in the anionic ligand having the formula (Ia) or (Ib) are electron withdrawing groups.

According to the invention, the groups $R^1$ and $R^2$ comprised in the anionic ligand having the formula Ia may be linked to each other to form a ring. This means that the groups $R^1$ and $R^2$ may be connected with each other via a covalent bond, in particular via a covalent single bond. In this context, the connection between the two moieties $R^1$ and $R^2$ is achieved in a way in that one hydrogen atoms of the $R^1$ moiety and one hydrogen atom of the $R^2$ moiety are replaced by the connecting covalent bond, respectively.

It was surprisingly found by the inventors that organic electronic devices as defined above comprising the inventive borane compound shows improved electronic properties, in particular have improved initial voltage, quantum efficiency and voltage stability.

It may be provided that the boron atom is directly bound to at least one nitrogen atom comprised in the anionic ligand via a covalent bond. In this regard, it may be provided that the nitrogen atom directly bound to the boron atom is one of the N-atoms explicitly shown in the formulas (Ia) and (Ib) above (carrying in the above formulas the negative charge, respectively), i.e. it may be provided that the nitrogen atom directly bound to the boron atom is not one of the nitrogen atoms which may potentially be comprised in the moieties $R^1$ to $R^6$ or $X^1$ in case that these moieties are selected as N-containing heteroalkyl or N-containing heteroaryl. In this way, it is possible to further improve the properties of the organic electronic device, in particular with respect to initial voltage, quantum efficiency and/or voltage stability thereof.

In the organic electronic device, it may be provided that at least 50%, alternatively at least 66%, alternatively at least 75%, alternatively at least 80%, alternatively at least 90%, alternatively at least 100% of the overall number of hydrogen atoms comprised in at least one moiety of the structural moieties $X^1$, $R^1$, $R^2$, $R^3$, $R^4$, $R^5$ and $R^6$ is replaced by substituents, wherein the substituents are independently selected from the group consisting of F, Cl, Br, I and CN. In this way, it is possible to further improve the properties of the organic electronic device, in particular with respect to initial voltage, quantum efficiency and/or voltage stability thereof.

In the embodiment outlined above, in which a certain amount (expressed in percentage) of the hydrogen atoms comprised in at least one of the structural moieties $R^1$, $R^2$, $R^3$, $R^4$, $R^5$ and $R^6$ is replaced by substituents, it is referred to the situation in which the respective moiety is initially unsubstituted. For example, in case that 50% of the overall number of hydrogen atoms of an alkyl group are replaced by substituents, reference is made to an unsubstituted alkyl group. In other words, the above embodiment refers to a particular case of substituted moieties in which the degree of substitution is to a certain extend. Furthermore, it is to be understood that degree of substitution in the above embodiment refers to the replacement of hydrogen atoms in a single moiety.

In the organic electronic device, it may further be provided that at least 50%, alternatively at least 66%, alternatively at least 75%, alternatively at least 80%, alternatively at least 90%, alternatively at least 100% of the overall number of hydrogen atoms comprised in all of the structural moieties $X_1$, $R_1$, $R_2$, $R_3$, $R_4$, $R_5$ and $R_6$ together is replaced by substituents independently selected from the group consisting of F, Cl, Br, I and CN. In this way, it is possible to further improve the properties of the organic electronic device, in particular with respect to initial voltage, quantum efficiency and/or voltage stability thereof.

Also in this embodiment, the outlined situation (replacement of hydrogen by a substituent) refers, of course, to the case, wherein the respective moieties are initially unsubstituted alkyl/aryl. This embodiment differs from the embodiment described above in that reference is made to the overall number of all hydrogen atoms comprised in all of the moieties $X^1$, $R^1$, $R^2$, $R^3$, $R^4$, $R^5$ and $R^6$ counted together.

It is to be understood that the term "electrical properties" refers to injection and/or transport of electrons in semiconducting materials and layers comprised in the device as defined herein.

With respect to the organic electronic device, it may be provided that the organic electronic device comprises a first electrode, a second electrode and an organic semiconducting layer, wherein the organic semiconducting layer is arranged between the first and the second electrode, and the organic semiconducting layer comprises the borane compound. In this way, it is possible to further improve the properties of the organic electronic device, in particular with respect to initial voltage, quantum efficiency and/or voltage stability thereof.

Furthermore, it may be provided with respect to the organic electronic device that the organic semiconducting layer is a hole injection layer, a hole transport layer or a hole generating layer. In this way, it is possible to further improve the properties of the organic electronic device, in particular with respect to initial voltage, quantum efficiency and/or voltage stability thereof.

In this regard, it may be provided that the organic electronic device comprises two or more of the above layers (hole injection layer, hole transport layer and hole generating layer), wherein it may be provided that more than one or all of these layers comprises the boron compound.

It may be further provided with respect to the organic electronic device that the organic electronic device is an organic electroluminescent device, an organic transistor, an organic diode or an organic photovoltaic device.

It may be further provided that the organic electroluminescent device is an organic light-emitting diode.

The inventive organic electronic device is an organic electronic device comprising at least one organic semiconductor layer, normally a variety of organic semiconductor layers. These layers may, for example, be prepared by evaporating a chemical compound and depositing the same on a substrate (or a foregoing layer) to form the layer. According to the invention, at least one of the layers of the device may be a hole injection layer, a hole transport layer or a hole generating layer and comprises the borane compound as defined herein. In this regard, it might be provided that the borane compound is comprised in the layer in addition to another material, for example in case that the borane compound is a dopant which is comprised in the layer together with a suitable matrix compound. Likewise, it may be provided that the respective layer is consisting of the borane compound, i.e. the layer does not comprise any further constituents (except for impurities which cannot be avoided by conventional technical means). In such a case of the layer consisting of the borane compound, the respective layer may be the hole injection layer.

If the borane compound is an electrical dopant, the electrical dopant (which may be embedded in a charge transport matrix compound) may improve the electrical conductivity of the matrix material and/or the injection of an electrical charge therein. The matrix material in such a layer is the predominant material.

It is to be understood that the term "electrical dopant" as used herein refers to a compound which improves the electrical properties of a semiconducting material and/or layer. As a result, conductivity, operating voltage, voltage rise over time, efficiency and or lifetime of a device comprising the doped semiconducting material and/or layer may be improved. The electrical dopant may be non-emissive.

In the organic electronic device, the at least one layer comprising the borane compound may be solid.

In the organic electronic device, the layer comprising the borane compound may be amorphous. In this regard, a bulk material which has a glass transition temperature measured by a standard procedure above room temperature is supposed to form an amorphous layer if the layer is provided by the same procedure as the bulk material (e.g. vacuum deposition or by evaporation of solution of the material in a specific solvent). The standard procedure is described in the experimental part.

The layer comprising the borane compound may be non-emissive.

The object is further achieved by an organic semiconducting material comprising a borane compound, the borane compound comprising at least one boron atom in the oxidation state (III) and at least one anionic ligand, the anionic ligand having the formula (Ia) or (Ib)

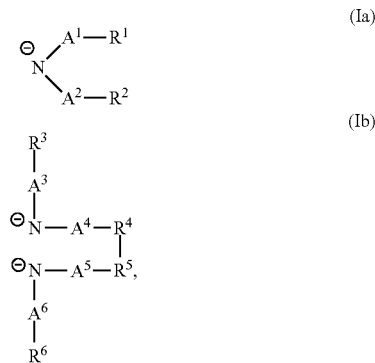

wherein in the formulas (Ia) and (Ib)
$A^1$ to $A^6$ are independently selected from the group consisting of CO, $SO_2$ or $PDX^1$;
$X^1$ is independently selected from the group consisting of halide, nitrile, halogenated or perhalogenated $C_1$ to $C_{20}$ alkyl, halogenated or perhalogenated $C_6$ to $C_{20}$ aryl, and halogenated or perhalogenated heteroaryl having 5 to 20 ring-forming atoms; and
$R^1$ to $R^6$ are independently selected from the group consisting of substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, and substituted or unsubstituted $C_5$ to $C_{20}$ heteroaryl, wherein it may be provided that $R^1$ and $R^2$ are linked to each other to form a ring.

In this regard, the embodiments mentioned above with respect to the boron compound comprised in the organic electronic device also apply to the case of the organic semiconducting material just as the technical effects achieved this way.

It was surprisingly found by the inventors that an organic semiconducting material as defined above is helpful to improve the initial voltage, the quantum efficiency and the voltage stability of an organic electronic device when being used therein, in particular when being used in a hole injection layer, a hole transport layer or a hole generating layer thereof.

With respect to the organic semiconducting material, it may be provided that the same further (in addition to the borane compound) comprises an organic matrix compound.

The organic semiconducting material may be a hole transporting material and the organic matrix compound may be an organic hole transport matrix compound.

In this regard, it may be provided that the organic hole transport matrix compound comprises a conjugated system of at least 6, alternatively at least 10, alternatively at least 14 delocalized electrons.

It may be further provided in this regard that the organic hole transport matrix compound is selected from the group of organic compounds comprising at least one amine nitrogen substituted with groups independently selected from aryl and heteroaryl. Non-limiting examples of suitable hole transport matrix materials are mentioned below.

It is to be understood that the term "semiconducting" in this regard is directed to materials and/or devices with electronic mechanism of conductivity. Electric current in semiconductors can be interpreted by flow of mobile electrons. This is a striking difference from electrical devices exploiting ion conductivity. Such devices (not according to the invention), for example galvanic cells, comprise an electrolyte with mobile ions, and electrical current therein is accompanied by ion flow through the electrolyte.

Furthermore, the object is achieved by a borane compound having the formula (II)

wherein $Q^1$ and $Q^2$ are independently selected from the group consisting of unsubstituted $C_1$ to $C_{30}$ hydrocarbyl, wherein $Q^1$ and $Q^2$ may optionally be linked to each other to form a ring; and Z is an anionic ligand, the anionic ligand having the formula (Ia) or (Ib)

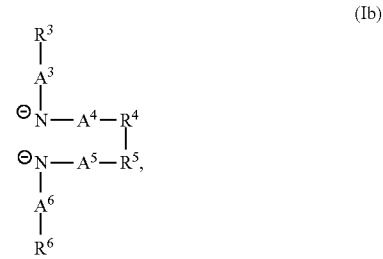

wherein in the formulas (Ia) and (Ib)
$A^1$ to $A^6$ are independently selected from the group consisting of CO, $SO_2$ or $PDX^1$;
$X^1$ is independently selected from the group consisting of halide, nitrile, halogenated or perhalogenated $C_1$ to $C_{20}$ alkyl, halogenated or perhalogenated $C_6$ to $C_{20}$ aryl, and halogenated or perhalogenated heteroaryl having 5 to 20 ring-forming atoms;
$R^1$ to $R^6$ are independently selected from the group consisting of substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, and substituted or unsubstituted $C_5$ to $C_{20}$ heteroaryl, wherein it may be provided that $R^1$ and $R^2$ are linked to each other to form a ring;

and
the compound having formula

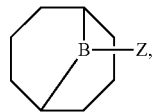
(IIa)

wherein Z is bis(trifluoromethylsulfonyl)imide anionic ligand,
is excluded.

It was surprisingly found by the inventors that the borane compound as defined above when being used in an organic electronic device or an organic semiconducting material, in particular in a hole injection layer, hole transport layer or hole generating layer is suitable to improve the initial voltage, quantum efficiency and/or voltage stability of a respective device.

With respect to the inventive borane compound, it may be provided that $Q^1$ and $Q^2$ are independently selected from the group consisting of $C_1$ to $C_{30}$ alkyl and $C_1$ to $C_{30}$ cycloalkyl.

With respect to the inventive borane compound, it may further be provided that $A^1$, $A^2$, $A^3$, $A^4$, $A^5$ and $A^6$ are independently selected from the group consisting of $SO_2$ and $PDX_1$, alternatively all $A^1$, $A^2$, $A^3$, $A^4$, $A^5$ and $A^6$ are $SO_2$.

With respect to the inventive borane compound, it may be further provided that $X^1$, $R^1$, $R^2$, $R^3$, $R^4$, $R^5$ and $R^6$ are each independently selected from halogenated $C_1$ to $C_{30}$ hydrocarbyl, alternatively perhalogenated $C_1$ to $C_{30}$ hydrocarbyl, alternatively from fluorinated $C_1$ to $C_{30}$ hydrocarbyl, alternatively from perfluorinated $C_1$ to $C_{30}$ hydrocarbyl.

In this regard, it may be further provided that in the inventive borane compound at least 50% alternatively at least 66%, alternatively at least 75%, alternatively at least 80%, alternatively at least 90%, alternatively at least 100% of the overall number of hydrogen atoms comprised in at least one moiety of the structural moieties $X^1$, $R^1$, $R^2$, $R^3$, $R^4$, $R^5$ and $R^6$ is replaced by substituents, wherein the substituents are independently selected from the group consisting of F, Cl, Br, I and CN.

Furthermore, it may be provided in the inventive compound that at least 50% %, alternatively at least 66%, alternatively at least 75%, alternatively at least 80%, alternatively at least 90%, alternatively at least 100% of the overall number of hydrogen atoms comprised in all of the structural moieties $X^1$, $R^1$, $R^2$, $R^3$, $R^4$, $R^5$ and $R^6$ together is replaced by substituents independently selected from the group consisting of F, Cl, Br, I and CN.

It may be provided that the inventive borane compound is one or more of the compounds E1-E2 of formula (IIa),

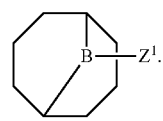
E1

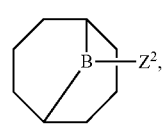
E2 compound E3 having formula

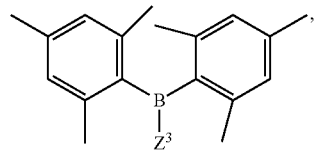
E3 or one or more of the compounds E4-E6 of formula (IIa),

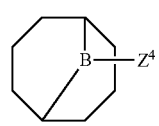
E4

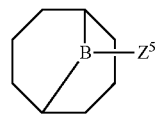
E5

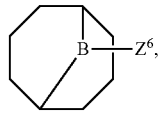
E6 wherein Z is the anionic ligand selected from structures $Z^1$-$Z^6$

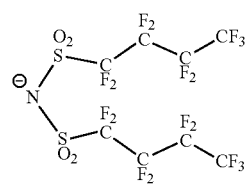
$Z^1$

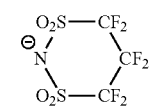
$Z^2$

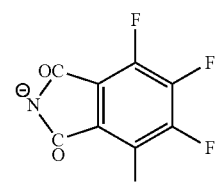
$Z^3, Z^4$

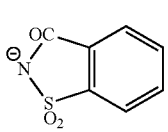
$Z^5$

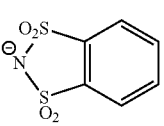
$Z^6$

Using the exemplary compounds, it is possible to further improve the properties of an organic electronic device comprising in particular with respect initial voltage, efficiency and/or voltage lifetime thereof.

The object is further achieved by a method for preparing the organic electronic device as defined herein, the method comprising the steps of:

(1) dissolving the borane compound comprising at least one boron atom in the oxidation state (III) and at least one anionic ligand, the anionic ligand having the formula (Ia) or (Ib)

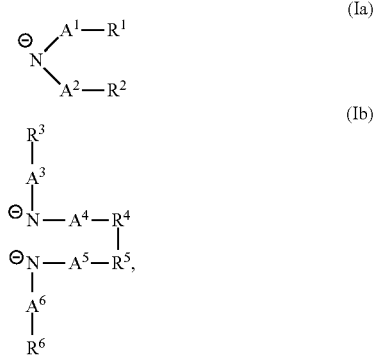

wherein in the formulas (Ia) and (Ib)
$A^1$ to $A^6$ are independently selected from the group consisting of $CO$, $SO_2$ or $PDX^1$;
$X^1$ is independently selected from the group consisting of halide, nitrile, halogenated or perhalogenated $C_1$ to $C_{20}$ alkyl, halogenated or perhalogenated $C_6$ to $C_{20}$ aryl, and halogenated or perhalogenated heteroaryl having 5 to 20 ring-forming atoms; and
$R^1$ to $R^6$ are independently selected from the group consisting of substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, and substituted or unsubstituted $C_5$ to $C_{20}$ heteroaryl, wherein it may be provided that $R^1$ and $R^2$ are linked to each other to form a ring in an appropriate solvent; and (2) depositing the borane compound from the solution on a solid support.

The object is further achieved by the use of the borane compound comprising at least one boron atom in the oxidation state (III) and at least one anionic ligand, the anionic ligand having the formula (Ia) or (Ib)

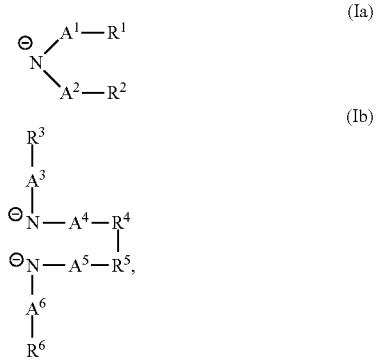

wherein in the formulas (Ia) and (Ib)
$A^1$ to $A^6$ are independently selected from the group consisting of $CO$, $SO_2$ or $PDX^1$;
$X^1$ is independently selected from the group consisting of halide, nitrile, halogenated or perhalogenated $C_1$ to $C_{20}$ alkyl, halogenated or perhalogenated $C_6$ to $C_{20}$ aryl, and halogenated or perhalogenated heteroaryl having 5 to 20 ring-forming atoms; and
$R^1$ to $R^6$ are independently selected from the group consisting of substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, and substituted or unsubstituted $C_5$ to $C_{20}$ heteroaryl, wherein it may be provided that $R^1$ and $R^2$ are linked to each other to form a ring for preparation of the organic electronic device.

Further Layers

In accordance with the invention, the organic electronic device may comprise, besides the layers already mentioned above, further layers. Exemplary embodiments of respective layers are described in the following:

Substrate

The substrate may be any substrate that is commonly used in manufacturing of organic electronic devices, such as organic light-emitting diodes. If light is to be emitted through the substrate, the substrate shall be a transparent or semitransparent material, for example a glass substrate or a transparent plastic substrate. If light is to be emitted through the top surface, the substrate may be both a transparent as well as a non-transparent material, for example a glass substrate, a plastic substrate, a metal substrate or a silicon substrate.

Anode Electrode

Either the first electrode or the second electrode may be an anode electrode. The anode electrode may be formed by depositing or sputtering a material that is used to form the anode electrode. The material used to form the anode electrode may be a high work-function material, so as to facilitate hole injection. The anode material may also be selected from a low work function material (i.e. aluminum). The anode electrode may be a transparent or reflective electrode. Transparent conductive oxides, such as indium tin oxide (ITO), indium zinc oxide (IZO), tin-dioxide ($SnO_2$), aluminum zinc oxide (AlZO) and zinc oxide (ZnO), may be used to form the anode electrode. The anode electrode may also be formed using metals, typically silver (Ag), gold (Au), or metal alloys.

Hole Injection Layer

In accordance with the invention, the hole injection layer may comprise the borane compound as described above in very detail. The hole injection layer (HIL) may be formed on the anode electrode by vacuum deposition, spin coating, printing, casting, slot-die coating, Langmuir-Blodgett (LB) deposition, or the like. When the HIL is formed using vacuum deposition, the deposition conditions may vary according to the compound that is used to form the HIL, and the desired structure and thermal properties of the HIL. In general, however, conditions for vacuum deposition may include a deposition temperature of 100° C. to 500° C., a pressure of $10^{-8}$ to $10^{-3}$ Torr (1 Torr equals 133.322 Pa), and a deposition rate of 0.1 to 10 nm/sec.

When the HIL is formed using spin coating or printing, coating conditions may vary according to the compound that is used to form the HIL, and the desired structure and thermal properties of the HIL. For example, the coating conditions may include a coating speed of about 2000 rpm to about 5000 rpm, and a thermal treatment temperature of about 80° C. to about 200° C. Thermal treatment removes a solvent after the coating is performed.

The HIL may be formed—in particular if the organic electronic device comprises another layer comprising the borane compound—of any compound that is commonly used to form a HIL. Examples of compounds that may be used to form the HIL include a phthalocyanine compound, such as copper phthalocyanine (CuPc), 4,4',4"-tris (3-methylphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly (4-styrenesulfonate) (PEDOT/PSS), polyaniline/camphor sulfonic acid (Pani/CSA), and polyaniline)/poly(4-styrenesulfonate (PANI/PSS).

In such a case, the HIL may be a pure layer of p-dopant or may be selected from a hole-transporting matrix compound doped with a p-dopant. Typical examples of known redox doped hole transport materials are: copper phthalocyanine (CuPc), which HOMO level is approximately −5.2 eV, doped with tetrafluoro-tetracyanoquinonedimethane (F4TCNQ), which LUMO level is about −5.2 eV; zinc phthalocyanine (ZnPc) (HOMO=−5.2 eV) doped with F4TCNQ; α-NPD (N,N'-Bis(naphthalen-1-yl)-N,N'-bis (phenyl)-benzidine) doped with F4TCNQ. α-NPD doped with 2,2'-(perfluoronaphthalen-2,6-diylidene) dimalononitrile (PD$_1$). α-NPD doped with 2,2',2"-(cyclopropane-1,2,3-triylidene)tris(2-(p-cyanotetrafluorophenyeacetonitrile) (PD2). Dopant concentrations can be selected from 1 to 20 wt.-%, more preferably from 3 wt.-% to 10 wt.-%.

The thickness of the HIL may be in the range from about 1 nm to about 100 nm, and for example, from about 1 nm to about 25 nm. When the thickness of the HIL is within this range, the HIL may have excellent hole injecting characteristics, without a substantial penalty in driving voltage.

Hole Transport Layer

In accordance with the invention, the hole transport layer may comprise as the borane compound as described above in detail.

The hole transport layer (HTL) may be formed on the HIL by vacuum deposition, spin coating, slot-die coating, printing, casting, Langmuir-Blodgett (LB) deposition, or the like. When the HTL is formed by vacuum deposition or spin coating, the conditions for deposition and coating may be similar to those for the formation of the HIL. However, the conditions for the vacuum or solution deposition may vary, according to the compound that is used to form the HTL.

In case that the HTL does not comprise the borane compound in accordance with the invention, but the borane compound is comprised in another layer, the HTL may be formed by any compound that is commonly used to form a HTL. Compounds that can be suitably used are disclosed for example in Yasuhiko Shirota and Hiroshi Kageyama, Chem. Rev. 2007, 107, 953-1010 and incorporated by reference. Examples of the compound that may be used to form the HTL are: carbazole derivatives, such as N-phenylcarbazole or polyvinylcarbazole; benzidine derivatives, such as N,N'-bis(3-methylphenyl)-N,N-diphenyl-[1,1-biphenyl]-4,4'-diamine (TPD), or N,N'-di(naphthalen-1-yl)-N,N'-diphenyl benzidine (alpha-NPD); and triphenylamine-based compound, such as 4,4',4"-tris(N-carbazolyetriphenylamine (TCTA). Among these compounds, TCTA can transport holes and inhibit excitons from being diffused into the EML.

The thickness of the HTL may be in the range of about 5 nm to about 250 nm, preferably, about 10 nm to about 200 nm, further about 20 nm to about 190 nm, further about 40 nm to about 180 nm, further about 60 nm to about 170 nm, further about 80 nm to about 160 nm, further about 100 nm to about 160 nm, further about 120 nm to about 140 nm. A preferred thickness of the HTL may be 170 nm to 200 nm.

When the thickness of the HTL is within this range, the HTL may have excellent hole transporting characteristics, without a substantial penalty in driving voltage.

Electron Blocking Layer

The function of the electron blocking layer (EBL) is to prevent electrons from being transferred from the emission layer to the hole transport layer and thereby confine electrons to the emission layer. Thereby, efficiency, operating voltage and/or lifetime are improved. Typically, the electron blocking layer comprises a triarylamine compound. The triarylamine compound may have a LUMO level closer to vacuum level than the LUMO level of the hole transport layer. The electron blocking layer may have a HOMO level that is further away from vacuum level compared to the HOMO level of the hole transport layer. The thickness of the electron blocking layer may be selected between 2 and 20 nm.

The electron blocking layer may comprise a compound of formula Z below (Z).

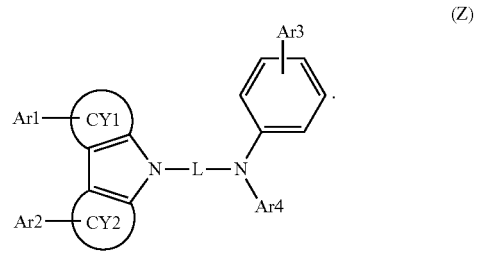

In Formula Z, CY1 and CY2 are the same as or different from each other, and each independently represent a benzene cycle or a naphthalene cycle, Ar1 to Ar3 are the same as or different from each other, and each independently selected from the group consisting of hydrogen; a substituted or unsubstituted aryl group having 6 to 30 carbon atoms; and a substituted or unsubstituted heteroaryl group having 5 to 30 carbon atoms, Ar4 is selected from the group consisting of a substituted or unsubstituted phenyl group, a substituted or unsubstituted biphenyl group, a substituted or unsubstituted terphenyl group, a substituted or unsubstituted triphenylene group, and a substituted or unsubstituted heteroaryl group having 5 to 30 carbon atoms, L is a substituted or unsubstituted arylene group having 6 to 30 carbon atoms.

If the electron blocking layer has a high triplet level, it may also be described as triplet control layer.

The function of the triplet control layer is to reduce quenching of triplets if a phosphorescent green or blue emission layer is used. Thereby, higher efficiency of light emission from a phosphorescent emission layer can be achieved. The triplet control layer is selected from triarylamine compounds with a triplet level above the triplet level of the phosphorescent emitter in the adjacent emission layer. Suitable compounds for the triplet control layer, in particular the triarylamine compounds, are described in EP 2 722 908 A1.

Emission Layer (EML)

The EML may be formed on the HTL by vacuum deposition, spin coating, slot-die coat-ing, printing, casting, LB deposition, or the like. When the EML is formed using vacuum deposition or spin coating, the conditions for deposition and coating may be similar to those for the formation of the HIL. However, the conditions for deposition and coating may vary, according to the compound that is used to form the EML.

The emission layer (EML) may be formed of a combination of a host and an emitter dopant. Example of the host are Alq₃, 4,4'-N,N'-dicarbazole-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yebenzene (TPBI), 3-tert-butyl-9,10-di-2-naphthylanthracenee (TBADN), distyrylarylene (DSA), bis(2-(2-hydroxyphenyl)benzo-thiazolate)zinc (Zn(BTZ)₂), G3 below, Compound 1 below, and Compound 2 below.

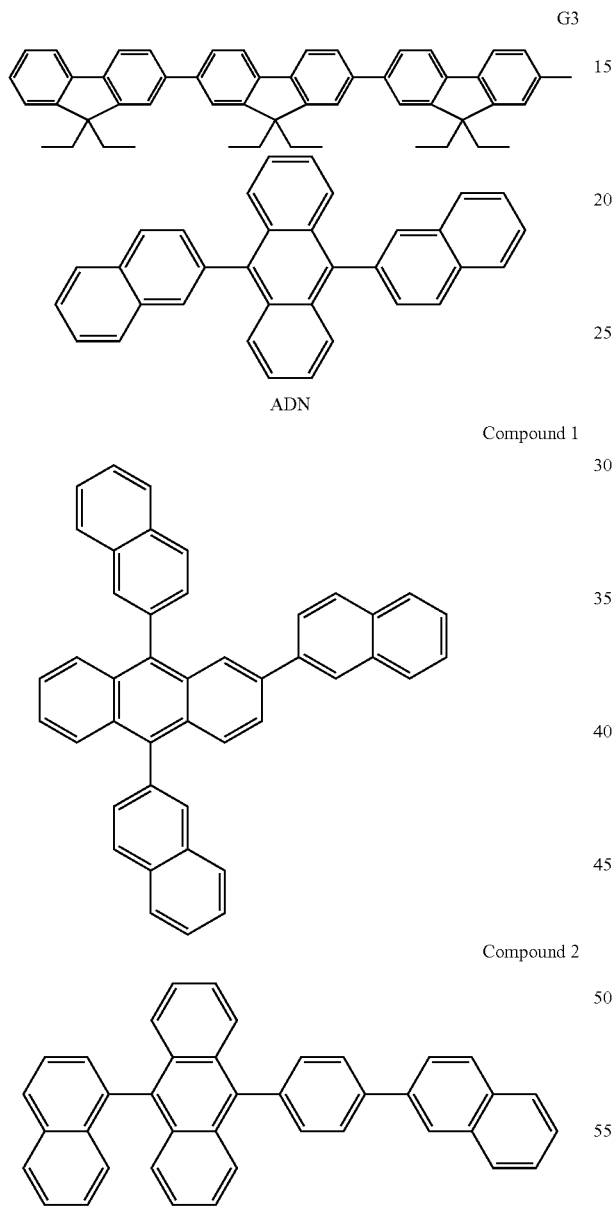

The emitter dopant may be a phosphorescent or fluorescent emitter. Phosphorescent emitters and emitters which emit light via a thermally activated delayed fluorescence (TADF) mechanism may be preferred due to their higher efficiency. The emitter may be a small molecule or a polymer.

Examples of red emitter dopants are PtOEP, Ir(piq)₃, and Btp₂Ir(acac), but are not limited thereto. These compounds are phosphorescent emitters, however, fluorescent red emitter dopants could also be used.

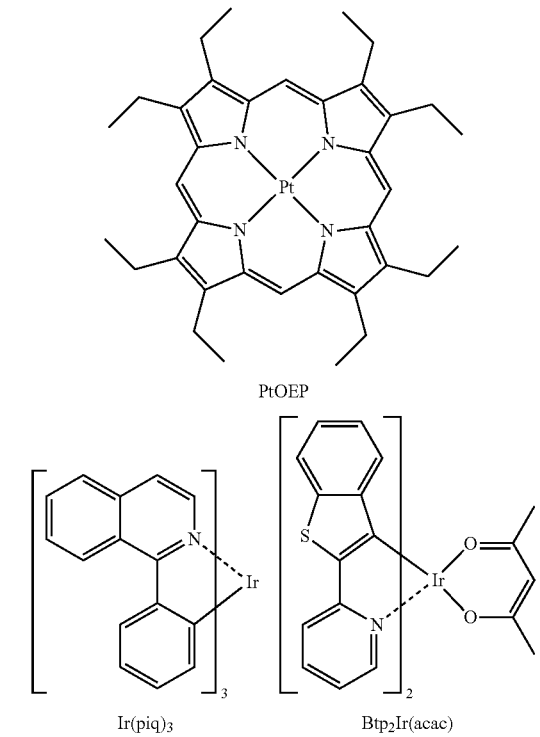

Examples of phosphorescent green emitter dopants are Ir(ppy)₃ (ppy=phenylpyridine), Ir(ppy)₂(acac), Ir(mpyp)₃ are shown below. Compound 3 is an example of a fluorescent green emitter and the structure is shown below.

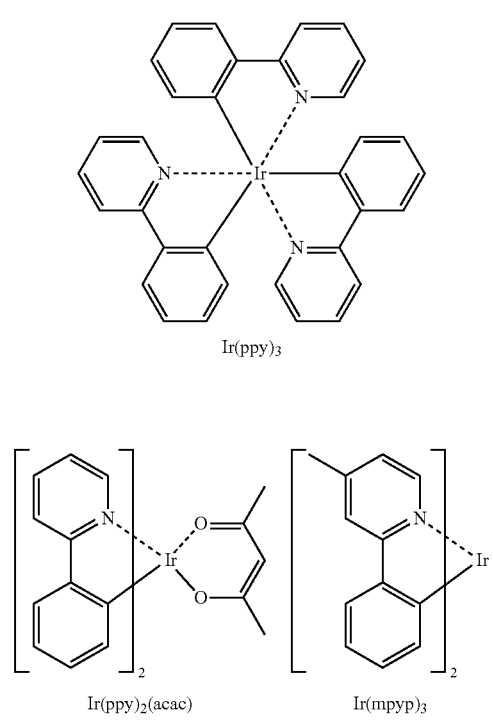

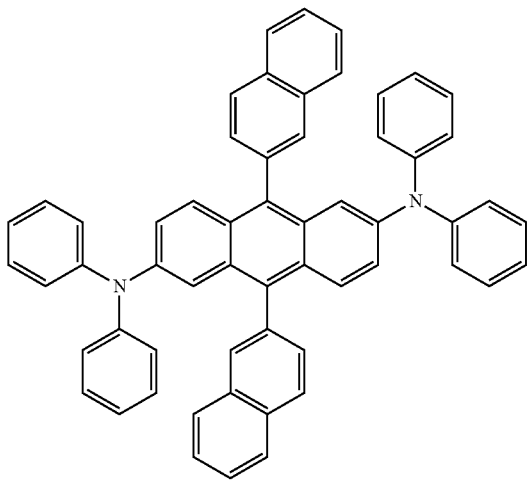

Compound 3

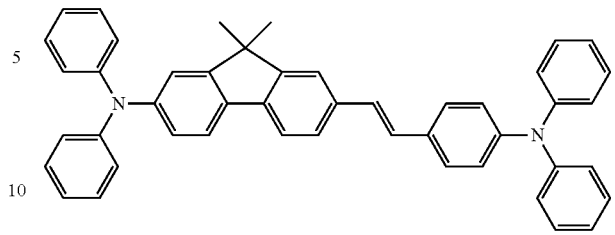

Compound 4

Examples of phosphorescent blue emitter dopants are F2Irpic, (F2ppy)2Ir(tmd) and Ir(dfppz)3, ter-fluorene, the structures are shown below. 4,4'-bis(4-diphenyl amiostyryl) biphenyl (DPAVBi), 2,5,8,11-tetra-tert-butyl perylene (TBPe), and Compound 4 below are examples of fluorescent blue emitter dopants.

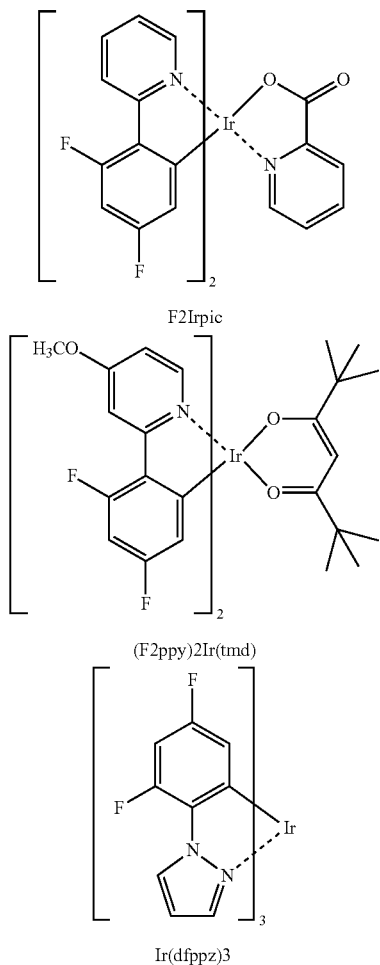

F2Irpic (F2ppy)2Ir(tmd)

Ir(dfppz)3

The amount of the emitter dopant may be in the range from about 0.01 to about 50 parts by weight, based on 100 parts by weight of the host. Alternatively, the emission layer may consist of a light-emitting polymer. The EML may have a thickness of about 10 nm to about 100 nm, for example, from about 20 nm to about 60 nm. When the thickness of the EML is within this range, the EML may have excellent light emission, without a substantial penalty in driving voltage.

Hole Blocking Layer (HBL)

A hole blocking layer (HBL) may be formed on the EML, by using vacuum deposition, spin coating, slot-die coating, printing, casting, LB deposition, or the like, in order to prevent the diffusion of holes into the ETL. When the EML comprises a phosphorescent dopant, the HBL may have also a triplet exciton blocking function.

When the HBL is formed using vacuum deposition or spin coating, the conditions for deposition and coating may be similar to those for the formation of the HIL. However, the conditions for deposition and coating may vary, according to the compound that is used to form the HBL. Any compound that is commonly used to form a HBL may be used. Examples of compounds for forming the HBL include oxadiazole derivatives, triazole derivatives, and phenanthroline derivatives.

The HBL may have a thickness in the range from about 5 nm to about 100 nm, for example, from about 10 nm to about 30 nm. When the thickness of the HBL is within this range, the HBL may have excellent hole-blocking properties, without a substantial penalty in driving voltage.

Electron Transport Layer (ETL)

The OLED according to the present invention may contain an electron transport layer (ETL).

According to various embodiments the OLED may comprise an electron transport layer or an electron transport layer stack comprising at least a first electron transport sub-layer and at least a second electron transport sub-layer.

By suitably adjusting energy levels of particular layers of the ETL, the injection and transport of the electrons may be controlled, and the holes may be efficiently blocked. Thus, the OLED may have long lifetime.

The electron transport layer of the organic electronic device may comprise an organic electron transport matrix (ETM) material. Further, the electron transport layer may comprise one or more n-dopants. Suitable compounds for the ETM are not particularly limited. In one embodiment, the electron transport matrix compounds consist of covalently bound atoms. Preferably, the electron transport matrix compound comprises a conjugated system of at least 6, more preferably of at least 10 delocalized electrons. In one embodiment, the conjugated system of delocalized electrons may be comprised in aromatic or heteroaromatic structural moieties, as disclosed e.g. in documents EP 1 970 371 A1 or WO 2013/079217 A1.

In one embodiment, the electron transport layer may be electrically doped with an electrical n-dopant. In another embodiment, the electron transport layer may comprise the second electron transport sub-layer which is arranged closer to the cathode than the first electron transport sub-layer and only the second electron transport sub-layer may comprise the electrical n-dopant.

The electrical n-dopant may be selected from electropositive elemental metals, and/or from metal salts and metal complexes of electropositive metals, particularly from elemental forms, salts and/or complexes of metal selected from alkali metals, alkaline earth metals, and rare earth metals.

Electron Injection Layer (EIL)

The optional EIL, which may facilitates injection of electrons from the cathode, may be formed on the ETL, preferably directly on the electron transport layer. Examples of materials for forming the EIL include lithium 8-hydroxyquinolinolate (LiQ), LiF, NaCl, CsF, $Li_2O$, BaO, Ca, Ba, Yb, Mg which are known in the art. Deposition and coating conditions for forming the EIL are similar to those for formation of the HIL, although the deposition and coating conditions may vary, according to the material that is used to form the EIL.

The thickness of the EIL may be in the range from about 0.1 nm to about 10 nm, for example, in the range from about 0.5 nm to about 9 nm. When the thickness of the EIL is within this range, the EIL may have satisfactory electron-injecting properties, without a substantial penalty in driving voltage.

Cathode Electrode

The cathode electrode is formed on the EIL if present. The cathode electrode may be formed of a metal, an alloy, an electrically conductive compound, or a mixture thereof. The cathode electrode may have a low work function. For example, the cathode electrode may be formed of lithium (Li), magnesium (Mg), aluminum (Al), aluminum (Al)-lithium (Li), calcium (Ca), barium (Ba), ytterbium (Yb), magnesium (Mg)-indium (In), magnesium (Mg)-silver (Ag), or the like. Alternatively, the cathode electrode may be formed of a transparent conductive oxide, such as ITO or IZO.

The thickness of the cathode electrode may be in the range from about 5 nm to about 1000 nm, for example, in the range from about 10 nm to about 100 nm. When the thickness of the cathode electrode is in the range from about 5 nm to about 50 nm, the cathode electrode may be transparent or semitransparent even if formed from a metal or metal alloy.

It is to be understood that the cathode electrode is not part of an electron injection layer or the electron transport layer.

Charge Generation Layer/Hole Generation Layer

The charge generation layer (CGL) may be composed of a double layer. In case that the charge generation layer is a p-type charge generation layer (hole generation layer), it may comprise the borane compound as defined herein.

Typically, the charge generation layer is a pn junction joining a n-type charge generation layer (electron generation layer) and a hole generation layer. The n-side of the pn junction generates electrons and injects them into the layer which is adjacent in the direction to the anode. Analogously, the p-side of the p-n junction generates holes and injects them into the layer which is adjacent in the direction to the cathode.

Charge generation layers are used in tandem devices, for example, in tandem OLEDs comprising, between two electrodes, two or more emission layers. In a tandem OLED comprising two emission layers, the n-type charge generation layer provides electrons for the first light emission layer arranged near the anode, while the hole generation layer provides holes to the second light emission layer arranged between the first emission layer and the cathode.

In accordance with the invention, it may be provided that the organic electronic device comprises a hole injection layer as well as a hole generation layer. If another layer than the hole generation layer comprises the borane compound as defined herein, it is not obligatory that also the hole generation layer comprises the borane compound as defined herein. In such a case, the hole generation layer can be composed of an organic matrix material doped with p-type dopant. Suitable matrix materials for the hole generation layer may be materials conventionally used as hole injection and/or hole transport matrix materials. Also, p-type dopant used for the hole generation layer can employ conventional materials. For example, the p-type dopant can be one selected from a group consisting of tetrafluore-7,7,8,8-tetracyanoquinodimethane (F4-TCNQ), derivatives of tetracyanoquinodimethane, radialene derivatives, iodine, $FeCl_3$, $FeF_3$, and $SbCl_5$. Also, the host can be one selected from a group consisting of N,N'-di(naphthalen-1-yl)-N,N-diphenyl-benzidine (NPB), N,N'-diphenyl-N,N'-bis(3-methylphenyl)-1,1-biphenyl-4,4'-diamine (TPD) and N,N',N'-tetranaphthyl-benzidine (TNB).

In an embodiment, the hole generation layer comprises the borane compound as defined herein as defined above in detail.

The n-type charge generation layer can be layer of a neat n-dopant, for example of an electropositive metal, or can consist of an organic matrix material doped with the n-dopant. In one embodiment, the n-type dopant can be alkali metal, alkali metal compound, alkaline earth metal, or alkaline earth metal compound. In another embodiment, the metal can be one selected from a group consisting of Li, Na, K, Rb, Cs, Mg, Ca, Sr, Ba, La, Ce, Sm, Eu, Tb, Dy, and Yb. More specifically, the n-type dopant can be one selected from a group consisting of Cs, K, Rb, Mg, Na, Ca, Sr, Eu and Yb. Suitable matrix materials for the electron generating layer may be the materials conventionally used as matrix materials for electron injection or electron transport layers. The matrix material can be for example one selected from a group consisting of triazine compounds, hydroxyquinoline derivatives like tris(8-hydroxyquinoline)aluminum, benzazole derivatives, and silole derivatives.

In one embodiment, the n-type charge generation layer may include compounds of the following Chemical Formula X.

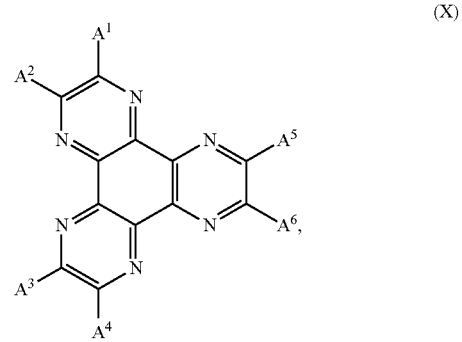

(X)

wherein each of A1 to A6 may be hydrogen, a halogen atom, nitrile (—CN), nitro (—$NO_2$), sulfonyl (—$SO_2R$), sulfoxide (—SOR), sulfonamide (—SO$_2$NR), sulfonate (—SO$_3$R), trifluoromethyl (—CF$_3$), ester (—COOR), amide (—CONHR or —CONRR'), substituted or unsubstituted straight-chain or branched-chain C1-C12 alkoxy, substituted or unsubstituted straight-chain or branched-chain C1-C12 alkyl, substituted or unsubstituted straight-chain or branched chain C2-C12 alkenyl, a substituted or unsubstituted aromatic or non-aromatic heteroring, substituted or unsubstituted aryl, substituted or unsubstituted mono- or di-arylamine, substituted or unsubstituted aralkylamine, or the like. Herein, each of the above R and R' may be substituted or unsubstituted C1-C60 alkyl, substituted or unsubstituted aryl, or a substituted or unsubstituted 5- to 7-membered heteroring, or the like.

An example of such n-type charge generation layer may be a layer comprising CNHAT

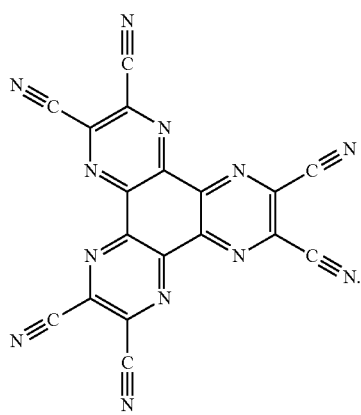

(CNHAT)

The hole generating layer is arranged on top of the n-type charge generation layer.

Organic Light-Emitting Diode (OLED)

According to one aspect of the present invention, there is provided an organic light-emitting diode (OLED) comprising: a substrate; an anode electrode formed on the substrate; a hole injection layer, a hole transport layer, an emission layer, and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, an electron transport layer, and a cathode electrode.

According to another aspect of the present invention, there is provided an OLED comprising: a substrate; an anode electrode formed on the substrate; a hole injection layer, a hole transport layer, an electron blocking layer, an emission layer, a hole blocking layer, an electron transport layer, an electron injection layer, and a cathode electrode.

According to various embodiments of the present invention, there may be provided OLEDs comprising layers arranged between the above mentioned layers, on the substrate or on the top electrode.

According to one aspect, the OLED can comprise a layer structure of a substrate that is adjacent arranged to an anode electrode, the anode electrode is adjacent arranged to a first hole injection layer, the first hole injection layer is adjacent arranged to a first hole transport layer, the first hole transport layer is adjacent arranged to a first electron blocking layer, the first electron blocking layer is adjacent arranged to a first emission layer, the first emission layer is adjacent arranged to a first electron transport layer, the first electron transport layer is adjacent arranged to an n-type charge generation layer, the n-type charge generation layer is adjacent arranged to a hole generating layer, the hole generating layer is adjacent arranged to a second hole transport layer, the second hole transport layer is adjacent arranged to a second electron blocking layer, the second electron blocking layer is adjacent arranged to a second emission layer, between the second emission layer and the cathode electrode an optional electron transport layer and/or an optional injection layer are arranged.

For example, the OLED according to FIG. 2 may be formed by a process, wherein on a substrate (110), an anode (120), a hole injection layer (130), a hole transport layer (140), an electron blocking layer (145), an emission layer (150), a hole blocking layer (155), an electron transport layer (160), an electron injection layer (180) and the cathode electrode (190) are subsequently formed in that order.

Details and Definitions of the Invention

The organic electronic device of the present invention comprises at least one (semiconducting) layer which may comprise a charge transport matrix compound and the borane compound. The borane compound may be embedded in the matrix material, i.e. the matrix material is the predominant material in such a layer. Likewise, it may be provided that the matrix material and the dopant are separated from each other in the semiconducting layer in a first sublayer comprising the matrix material and a second sublayer comprising the dopant, or, in a preferred embodiment, respectively consisting thereof. Likewise, it may be provided that the layer is consisting of the borane compound.

The borane compound may diffuse into the adjacent layers after deposition, in particular the borane compound may diffuse into the layer on which it is deposited.

The organic electronic device is described herein may be an organic electronic device based on semiconducting layers. In particular, the hole injection layer, the hole transport layer and the hole generating layer are semiconducting layers.

The term "hydrocarbyl group" as used herein shall be understood to encompass any organic group comprising carbon atoms, in particular organic groups, such as alkyl, aryl, heteroaryl, heteroalkyl, in particular such groups which are substituents usual in organic electronics.

The term "alkyl" as used herein shall encompass linear as well as branched and cyclic alkyl. For example, $C_3$-alkyl may be selected from n-propyl and iso-propyl. Likewise, $C_4$-alkyl encompasses n-butyl, sec-butyl and t-butyl. Likewise, $C_6$-alkyl encompasses n-hexyl and cyclo-hexyl.

The subscribed number n in $C_n$ relates to the total number of carbon atoms in the respective alkyl, arylene, heteroarylene or aryl group.

The term "aryl" as used herein shall encompass phenyl ($C_6$-aryl), fused aromatics, such as naphthalene, anthracene, phenanthrene, tetracene etc. Further encompassed are biphenyl and oligo- or polyphenyls, such as terphenyl etc. Further encompassed shall be any further aromatic hydrocarbon substituents, such as fluorenyl etc. Arylene, respectively heteroarylene refers to groups to which two further moieties are attached.

The term "heteroaryl" as used herein refers to aryl groups in which at least one carbon atom is substituted by a heteroatom, preferably selected from N, O, S, B or Si.

The term "halogenated" refers to an organic compound in which one hydrogen atom thereof is replaced by a halogen atom. The term "perhalogenated" refers to an organic compound in which all of the hydrogen atoms thereof are replaced by halogen atoms. The meaning of the terms "fluorinated" and "perfluorinated" should be understood analogously.

The subscripted number n in $C_n$-heteroaryl merely refers to the number of carbon atoms excluding the number of heteroatoms. In this context, it is clear that a $C_3$ heteroarylene group is an aromatic compound comprising three carbon atoms, such as pyrazol, imidazole, oxazole, thiazole and the like.

In terms of the invention, the expression "between" with respect to one layer being between two other layers does not exclude the presence of further layers which may be arranged between the one layer and one of the two other layers. In terms of the invention, the expression "in direct contact" with respect to two layers being in direct contact with each other means that no further layer is arranged between those two layers. One layer deposited on the top of another layer is deemed to be in direct contact with this layer.

In the context of the present specification the term "essentially non-emissive" or "non-emissive" means that the contribution of the compound or layer to the visible emission spectrum from the device is less than 10%, preferably less than 5% relative to the visible emission spectrum. The visible emission spectrum is an emission spectrum with a wavelength of about ≥380 nm to about ≤780 nm.

Preferably, the organic semiconducting layer comprising at least one electrical dopant is essentially non-emissive or non-emitting.

With respect to the inventive electronic device, the compounds mentioned in the experimental part may be most preferred.

The inventive electronic device may be an organic electroluminescent device (OLED) an organic photovoltaic device (OPV) or an organic field-effect transistor (OFET).

According to another aspect, the organic electroluminescent device according to the present invention may comprise more than one emission layer, preferably two or three emission layers. An OLED comprising more than one emission layer is also described as a tandem OLED or stacked OLED.

The organic electroluminescent device (OLED) may be a bottom- or top-emission device.

Another aspect is directed to a device comprising at least one organic electroluminescent device (OLED). A device comprising organic light-emitting diodes is for example a display or a lighting panel.

In the present invention, the following defined terms, these definitions shall be applied, unless a different definition is given in the claims or elsewhere in this specification.

In the context of the present specification the term "different" or "differs" in connection with the matrix material means that the matrix material differs in their structural formula.

The energy levels of the highest occupied molecular orbital, also named HOMO, and of the lowest unoccupied molecular orbital, also named LUMO, are measured in electron volt (eV).

The terms "OLED" and "organic light-emitting diode" are simultaneously used and have the same meaning. The term "organic electroluminescent device" as used herein may comprise both organic light emitting diodes as well as organic light emitting transistors (OLETs).

As used herein, "weight percent", "wt.-%", wt %, "percent by weight", "% by weight", and variations thereof refer to a composition, component, substance or agent as the weight of that component, substance or agent of the respective electron transport layer divided by the total weight of the respective electron transport layer thereof and multiplied by 100. It is understood that the total weight percent amount of all components, substances and agents of the respective electron transport layer and electron injection layer are selected such that it does not exceed 100 wt.-%.

As used herein, "volume percent", "vol.-%", "percent by volume", "% by volume", and variations thereof refer to a composition, component, substance or agent as the volume of that component, substance or agent of the respective electron transport layer divided by the total volume of the respective electron transport layer thereof and multiplied by 100. It is understood that the total volume percent amount of all components, substances and agents of the cathode layer are selected such that it does not exceed 100 vol.-%.

All numeric values are herein assumed to be modified by the term "about", whether or not explicitly indicated. As used herein, the term "about" refers to variation in the numerical quantity that can occur. Whether or not modified by the term "about" the claims include equivalents to the quantities.

It should be noted that, as used in this specification and the appended claims, the singular forms "a", "an", and "the" include plural referents unless the content clearly dictates otherwise.

The term "free of", "does not contain", "does not comprise" does not exclude impurities. Impurities have no technical effect with respect to the object achieved by the present invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

EMBODIMENTS OF THE INVENTIVE DEVICE

Figure 1:
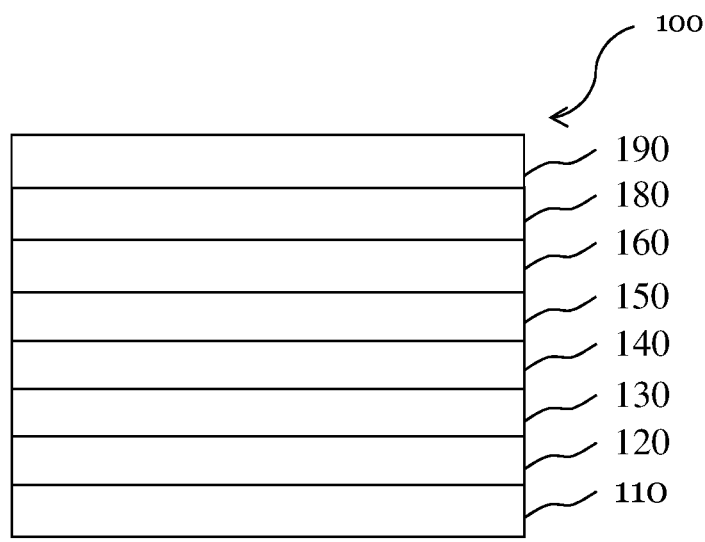
FIG. 1 is a schematic sectional view of an organic light-emitting diode (OLED), according to an exemplary embodiment of the present invention.

Reference will now be made in detail to the exemplary embodiments of the present invention, examples of which are illustrated in the accompanying drawings, wherein like reference numerals refer to the like elements throughout.

The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed there between. When a first element is referred to as being formed or disposed "directly on" a second element, no other elements are disposed there between.

FIG. 1 is a schematic sectional view of an organic light-emitting diode (OLED) 100, according to an exemplary embodiment of the present invention. The OLED 100 includes a substrate 110, an anode 120, a hole injection layer (HIL) 130, a hole transport layer (HTL) 140, an emission layer (EML) 150, an electron transport layer (ETL) 160. The electron transport layer (ETL) 160 is formed directly on the EML 150. Onto the electron transport layer (ETL) 160, an electron injection layer (EIL) 180 is disposed. The cathode 190 is disposed directly onto the electron injection layer (EIL) 180.

Instead of a single electron transport layer 160, optionally an electron transport layer stack (ETL) can be used.

Figure 2:
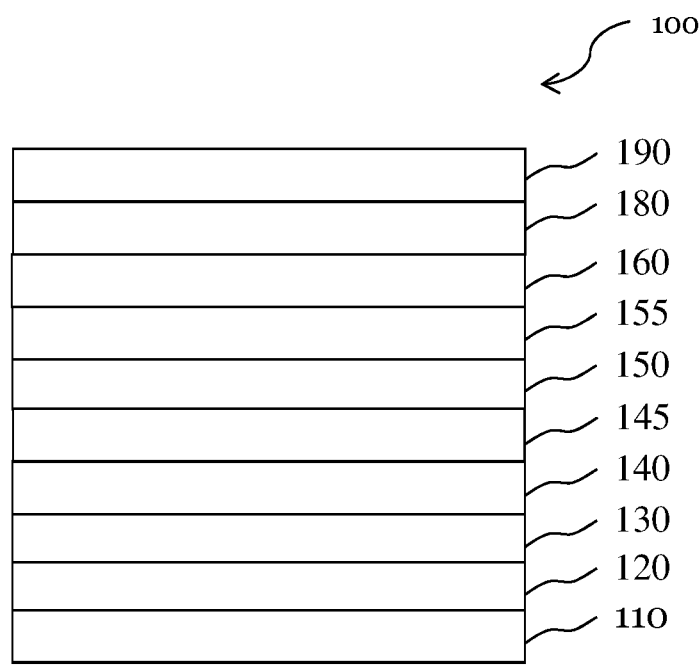
FIG. 2 is a schematic sectional view of an OLED, according to an exemplary embodiment of the present invention.

FIG. 2 is a schematic sectional view of an OLED 100, according to another exemplary embodiment of the present invention. FIG. 2 differs from FIG. 1 in that the OLED 100 of FIG. 2 comprises an electron blocking layer (EBL) 145 and a hole blocking layer (HBL) 155.

Referring to FIG. 2, the OLED 100 includes a substrate 110, an anode 120, a hole injection layer (HIL) 130, a hole transport layer (HTL) 140, an electron blocking layer (EBL) 145, an emission layer (EML) 150, a hole blocking layer (HBL) 155, an electron transport layer (ETL) 160, an electron injection layer (EIL) 180 and a cathode electrode 190.

Figure 3:
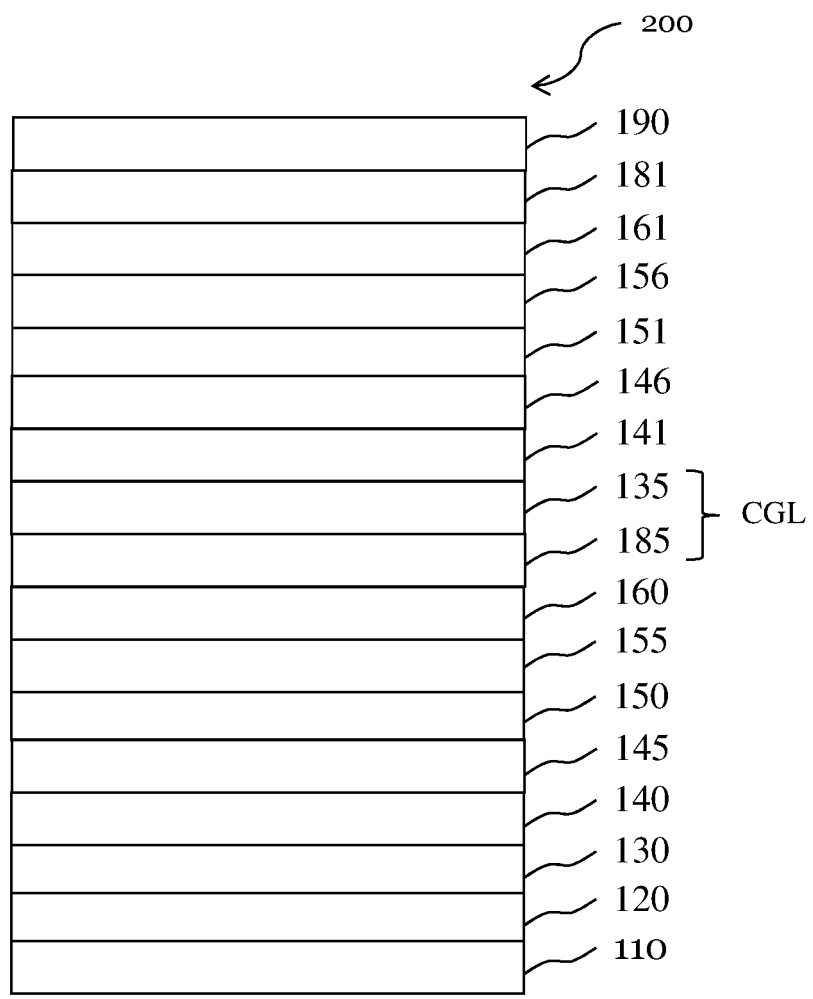
FIG. 3 is a schematic sectional view of a tandem OLED comprising a charge generation layer, according to an exemplary embodiment of the present invention.

FIG. 3 is a schematic sectional view of a tandem OLED 200, according to another exemplary embodiment of the present invention. FIG. 3 differs from FIG. 2 in that the OLED 100 of FIG. 3 further comprises a charge generation layer and a second emission layer.

Referring to FIG. 3, the OLED 200 includes a substrate 110, an anode 120, a first hole injection layer (HIL) 130, a first hole transport layer (HTL) 140, a first electron blocking layer (EBL) 145, a first emission layer (EML) 150, a first hole blocking layer (HBL) 155, a first electron transport layer (ETL) 160, an n-type charge generation layer (n-type CGL) 185, a hole generating layer (p-type charge generation layer; p-type GCL) 135, a second hole transport layer (HTL) 141, a second electron blocking layer (EBL) 146, a second emission layer (EML) 151, a second hole blocking layer (EBL) 156, a second electron transport layer (ETL) 161, a second electron injection layer (EIL) 181 and a cathode 190.

While not shown in FIG. 1, FIG. 2 and FIG. 3, a sealing layer may further be formed on the cathode electrodes 190, in order to seal the OLEDs 100 and 200. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

Experimental Part

The formulae of the supporting materials mentioned below are as follows:

$F_1$ is

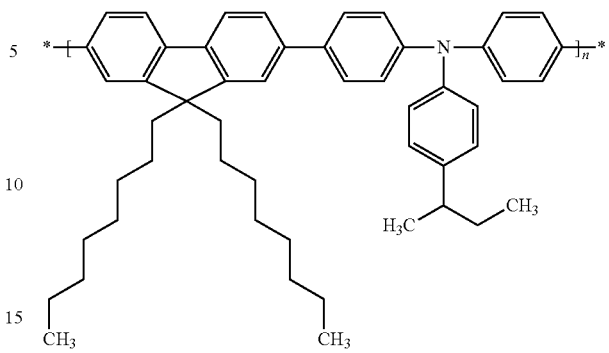

(Poly[(9,9-dioctylfluorenyl-2,7-diyl)-co-(4,4'-(N-(4-sec-butylphenyediphenylamine)], commercially available from Solaris Chem Inc)

$F_2$ is

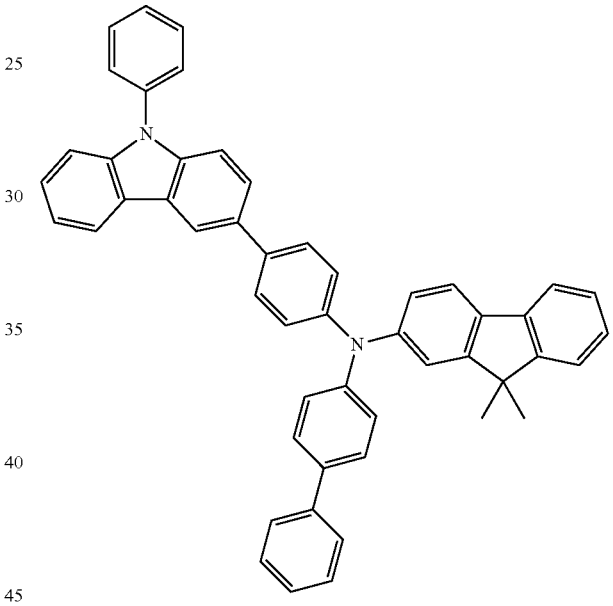

N-([1,1'-biphenyl]-4-yl)-9,9-dimethyl-N-(4-(9-phenyl-9H-carbazol-3-yl)phenyl)-9H-fluoren-2-amine, CAS 1242056-42-3;

$F_3$ is

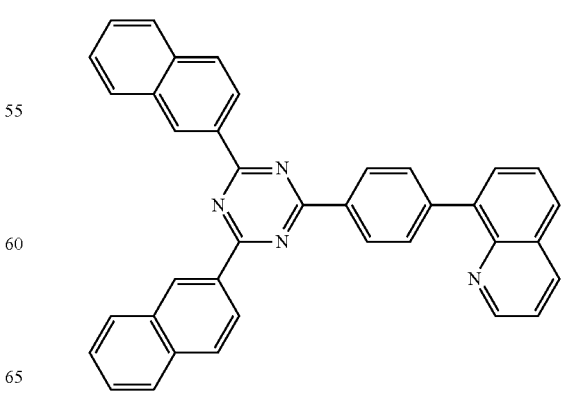

8-(4-(4,6-di(naphthalen-2-yl)-1,3,5-triazin-2-yl)phenyl)quinoline, CAS 1312928-44-1;

ABH-113 is an emitter host and NUBD-370 and DB-200 are blue fluorescent emitter dopants, all commercially available from SFC, Korea.

ITO is indium tin oxide.

Preparation of Exemplary Compounds

Generic Synthesis Procedure A

A suspension of 0.5 equiv. of 9-borabicyclo[3.3.1]nonane dimer (1.0 equiv. of the monomer) and 1.0 equiv. of a corresponding imide in dry toluene was carefully heated under a dry $N_2$ atmosphere at 90° C. for 1 h. Intensive gas liberation was observed while heating, and a clear solution was formed. The resulting solution was distilled in vacuum. Compounds E2 and E1 were isolated as a fraction boiling at 100-120° C. (1.5 Torr). Solid compounds E4, E5 and E6 were isolated by filtration and washed with dry hexane.

Synthesis of Compound E3

A suspension of 0.5 equiv. of dimesitylhydroborane dimer (1.0 equiv. of the monomer) and 1.0 equiv. of a corresponding imide in dry toluene was carefully heated under a dry $N_2$ atmosphere at 90° C. for 1 h. Intensive gas liberation was observed while heating, and a clear solution was formed. The resulting solution was distilled in vacuum. Product was washed with dry hexane.

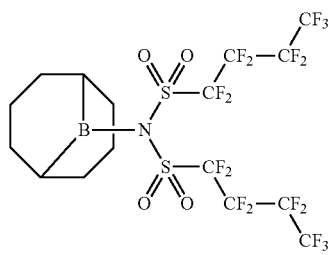

E1

Yield 54%, white solid;
$^1$H NMR (600 MHz, CDCl$_3$): δ=1.13-1.15 (m, 1H), 1.37-1.41 (m, 2H), 1.46-1.50 (m, 1H), 1.81-1.94 (m, 10H);
$^{19}$F NMR (377 MHz, CDCl$_3$): δ=−126.12 (m, 4F), −120.93 (m, 4F), −106.17 (br s, 4F), −81.07 (t, J=9.6 Hz, 6F); further splitting due to multiple $^{19}$F, $^{19}$F couplings;
$^{11}$B NMR (192 MHz, CDCl$_3$): δ=59.2 (s).

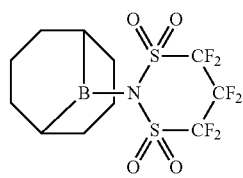

E2

Yield 51%, yellow viscous liquid;
$^1$H NMR (600 MHz, C$_6$D$_6$): δ=1.12-1.15 (m, 2H), 1.61-1.70 (m, 12H);
$^{11}$B NMR (192 MHz, C$_6$D$_6$): δ=71 (s); 59 (s)

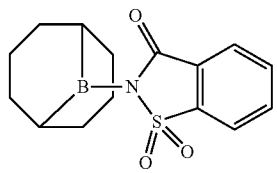

E3

Yield 57%, pale yellow solid;
$^1$H NMR (600 MHz, C$_6$D$_6$): δ=2.14 (s, 6H, 2xMe), 2.27 (s, 12H, 4xMe), 6.74 (s, 4H, H$_{Ar}$);
$^{11}$B NMR (192 MHz, C$_6$D$_6$): δ=57.8 (s).

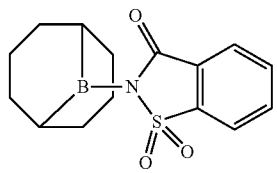

E4

Yield 55%, yellow solid;
$^1$H NMR (600 MHz, C$_6$D$_6$): δ=1.31-1.36 (m, 3H), 1.87-1.96 (m, 10H), 2.86 (s, 1H);
$^{11}$B NMR (192 MHz, C$_6$D$_6$): δ=66.0 (s); optional 58.3 (s).

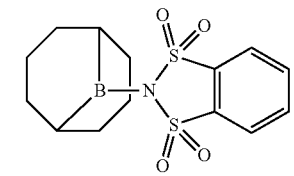

E5

Yield 60%, pale yellow solid;
$^1$H NMR (600 MHz, C$_6$D$_6$): 1.30-1.32 (m, 2H), 1.83-1.93 (m, 6H), 1.98-2.05 (m, 4H), 2.94 (s, 2H), 6.68-6.72 (m, 2H, H$_{Ar}$), 7.11 (d, $^3$J=6.5 Hz, 1H, H$_{Ar}$), 7.44 (d, $^3$J=6.3 Hz, 1H, H$_{Ar}$); $^{11}$B NMR (192 MHz, C$_6$D$_6$): δ=62.8 (s); optional 58.0 (s)

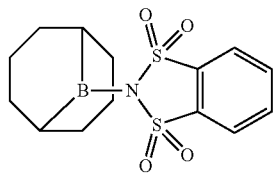

E6

Yield 58%, pale yellow solid;
$^1$H NMR (600 MHz, C$_6$D$_6$): δ=1.20-1.25 (m, 2H), 1.68-1.76 (m, 2H), 1.80-1.83 (m, 4H), 1.98-2.04 (m, 4H), 2.69 (s, 2H), 6.41-6.42 (m, 2H, H$_{Ar}$), 6.95-6.97 (m, 2H, H$_{Ar}$); $^{11}$B NMR (192 MHz, C$_6$D$_6$): δ=60.7 (s).

The depicted structures are schematic, observed presence of multiple signals in $^{11}$B NMR spectra is an evidence for varying coordination modes of the anionic ligand.

Device Experiments
Standard Procedures
Voltage Stability

OLEDs are driven by constant current circuits. Those circuits can supply a constant current over a given voltage range. The wider the voltage range, the wider the power losses of such devices. Hence, the change of driving voltage upon driving needs to be minimized.

The driving voltage of an OLED is temperature dependent. Therefore, voltage stability needs to be judged in thermal equilibrium. Thermal equilibrium is reached after one hour of driving.

Voltage stability is measured by taking the difference of the driving voltage after 50 hours and after 1 hour driving at a constant current density. Here, a current density of 30 mA/cm² is used. Measurements are done at room temperature.

$$dU[V] = U(50\ h, 30\ mA/cm^2) - U(1\ h, 30\ mA/cm^2)$$

EXAMPLES

Blue fluorescent OLED comprising a hole injection layer p-doped with an imidoborane compound
Table 1a schematically describes the model device.

TABLE 1a

| Material | c [wt %] | d [nm] |
|---|---|---|
| ITO | 100 | 90 |
| F1: p-dopant | 92:8 (mol %#) | 45 |
| F2 | 100 | 85 |
| ABH113: NUBD370 | 3 | 20 |
| F3: LiQ | 50 | 36 |
| Al | 100 | 100 | based on molar amount of metal atoms

The results are given in Table 2b

TABLE 1b

| | U* [V] | EQE* [%] | CIE-y* | U(50 h)-U(1 h)** [V] |
|---|---|---|---|---|
| Li(TFSI) (reference) | 4.0 | 6.2 | 0.091 | 1.3 |
| E1 | 4.1 | 6.5 | 0.095 | |
| E2 | 4.0 | 6.5 | 0.091 | 0.4 |

*j = 15 mA/cm²
**j = 30 mA/cm²

Concerning initial voltage and EQE, E1 and E2 perform at least equally good or even better as the comparative material LiTFSI. Additionally, a better performance in terms of voltage stability is observed for E2.

The features disclosed in the foregoing description and in the dependent claims may, both separately and in any combination thereof, be material for realizing the aspects of the disclosure made in the independent claims, in diverse forms thereof.

Key symbols and abbreviations used throughout the application:
CV cyclic voltammetry
DSC differential scanning calorimentry
EBL electron blocking layer
EIL electron injecting layer
EML emitting layer
eq. equivalent
ETL electron transport layer
ETM electron transport matrix
Fc ferrocene
Fc⁺ ferricenium
HBL hole blocking layer
HIL hole injecting layer
HOMO highest occupied molecular orbital
HPLC high performance liquid chromatography
HTL hole transport layer
p-HTL p-doped hole transport layer
HTM hole transport matrix
ITO indium tin oxide
LUMO lowest unoccupied molecular orbital
mol % molar percent
NMR nuclear magnetic resonance
OLED organic light emitting diode
OPV organic photovoltaics
PTFE polytetrafluoroethylene
QE quantum efficiency
$R_f$ retardation factor in TLC
RGB red-green-blue
TCO transparent conductive oxide
TFT thin film transistor
$T_g$ glass transition temperature
TLC thin layer chromatography
VTE vacuum thermal evaporation
wt % weight percent

The invention claimed is:

1. Organic electronic device comprising a borane compound, the borane compound comprising at least one boron atom in the oxidation state (III) and at least one anionic ligand, the anionic ligand having the formula (Ia) or (Ib)

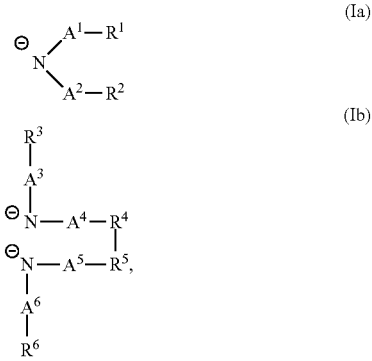

wherein in the formulas (Ia) and (Ib)
$A^1$ to $A^6$ are independently selected from the group consisting of CO, SO₂ or PDX¹;
$X^1$ is independently selected from the group consisting of halide, nitrile, halogenated or perhalogenated C₁ to C₂₀ alkyl, halogenated or perhalogenated C₆ to C₂₀ aryl, and halogenated or perhalogenated heteroaryl having 5 to 20 ring-forming atoms; and
$R^1$ to $R^6$ are independently selected from the group consisting of substituted or unsubstituted C₁ to C₂₀ alkyl, substituted or unsubstituted C₁ to C₂₀ heteroalkyl, substituted or unsubstituted C₆ to C₂₀ aryl, and substituted or unsubstituted $C_5$ to $C_{20}$ heteroaryl, wherein it may be provided that $R^1$ and $R^2$ are linked to each other to form a ring.

2. Organic electronic device according to claim 1, wherein the boron atom is directly bound to at least one nitrogen atom comprised in the anionic ligand via a covalent bond.

3. Organic electronic device according to claim 1, wherein at least 50% of the overall number of hydrogen atoms comprised in at least one moiety of the structural moieties $X^1$, $R^1$, $R^2$, $R^3$, $R^4$, $R^5$ and $R^6$ is replaced by substituents, wherein the substituents are independently selected from the group consisting of F, Cl, Br, I and CN.

4. Organic electronic device according to claim 1, wherein at least 50% of the overall number of hydrogen atoms comprised in all of the structural moieties $X^1$, $R^1$, $R^2$, $R^3$, $R^4$, $R^5$ and $R^6$ together is replaced by substituents independently selected from the group consisting of F, Cl, Br, I and CN.

5. Organic electronic device according to claim 1, wherein the organic electronic device comprises a first electrode, a second electrode and an organic semiconducting layer, wherein the organic semiconducting layer is arranged between the first and the second electrode, and the organic semiconducting layer comprises the borane compound.

6. Organic electronic device according to claim 5, wherein the organic semiconducting layer is a hole injection layer, a hole transport layer or a hole generating layer.

7. Organic electronic device according to claim 1, wherein the organic electronic device is an organic electroluminescent device, an organic transistor, an organic diode or an organic photovoltaic device.

8. Organic electronic device according to claim 7, wherein the organic electroluminescent device is an organic light emitting diode.

9. Organic semiconducting material comprising the borane compound as defined in claim 1.

10. Borane compound having the formula (II)

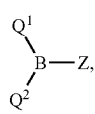
(II)

wherein $Q^1$ and $Q^2$ are independently selected from the group consisting of unsubstituted $C_1$ to $C_{30}$ hydrocarbyl, wherein $Q^1$ and $Q^2$ may optionally be linked to each other to form a ring; and Z is an anionic ligand, the anionic ligand having the formula (Ia) or (Ib)

(Ia)

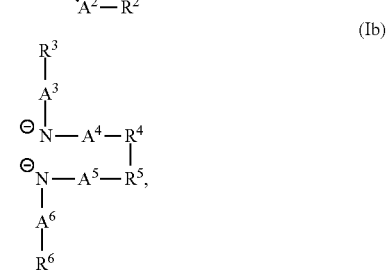
(Ib)

wherein in the formulas (Ia) and (Ib)

$A^1$ to $A^6$ are independently selected from the group consisting of CO, $SO_2$ or $PDX^1$;

$X^1$ is independently selected from the group consisting of halide, nitrile, halogenated or perhalogenated $C_1$ to $C_{20}$ alkyl, halogenated or perhalogenated $C_6$ to $C_{20}$ aryl, and halogenated or perhalogenated heteroaryl having 5 to 20 ring-forming atoms;

$R^1$ to $R^6$ are independently selected from the group consisting of substituted or unsubstituted $C_1$ to $C_{20}$ alkyl, substituted or unsubstituted $C_1$ to $C_{20}$ heteroalkyl, substituted or unsubstituted $C_6$ to $C_{20}$ aryl, and substituted or unsubstituted $C_5$ to $C_{20}$ heteroaryl, wherein it may be provided that $R^1$ and $R^2$ are linked to each other to form a ring;

and
the compound having formula

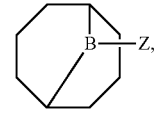
(IIa)

wherein Z is bis(trifluoromethylsulfonyl)imide anionic ligand,
is excluded.

* * * * *